(12) United States Patent
Shen et al.

(10) Patent No.: US 10,020,426 B1
(45) Date of Patent: Jul. 10, 2018

(54) LIGHT EMITTING DEVICE

(71) Applicant: ADVANCED OPTOELECTRONIC TECHNOLOGY, INC., Hsinchu, Hsien (TW)

(72) Inventors: Chia-Hui Shen, Hsinchu (TW); Tzu-Chien Hung, Hsinchu (TW); Chien-Chung Peng, Hsinchu (TW); Chien-Shiang Huang, Hsinchu (TW); Chih-Jung Liu, Hsinchu (TW)

(73) Assignee: ADVANCED OPTOELECTRONIC TECHNOLOGY, INC, Hsinchu, Hsien (TW)

( * ) Notice: Subject to any disclaimer, the term of this patent is extended or adjusted under 35 U.S.C. 154(b) by 0 days.

(21) Appl. No.: 15/482,986

(22) Filed: Apr. 10, 2017

(51) Int. Cl.
*H01L 33/00* (2010.01)
*H01L 33/48* (2010.01)
*H01L 33/60* (2010.01)

(52) U.S. Cl.
CPC ............ *H01L 33/483* (2013.01); *H01L 33/60* (2013.01)

(58) Field of Classification Search
USPC ......... 257/81, 82, 91, 98, 99, 100, 116, 117, 257/432–437, 749, E33.056–E33.059, 257/E29.032; 438/25–28, 51, 55, 64–68, 438/83, 98
See application file for complete search history.

(56) References Cited

U.S. PATENT DOCUMENTS

| 2015/0060897 | A1 | 3/2015 | Min et al. |
| 2016/0049561 | A1 | 2/2016 | Daeschner et al. |
| 2016/0260872 | A1* | 9/2016 | Butterworth ............ H01L 33/54 |
| 2016/0293794 | A1* | 10/2016 | Nuzzo .................... B82Y 10/00 |

FOREIGN PATENT DOCUMENTS

CN       101997077 A      3/2011

* cited by examiner

*Primary Examiner* — Tram H Nguyen
(74) *Attorney, Agent, or Firm* — ScienBiziP, P.C.

(57) ABSTRACT

A light emitting device includes a base and a light emitting diode chip, the light emitting diode chip is formed on a top surface of the base, an outline of a projection of the light emitting diode chip projected on the top surface of the base is positioned in the top surface of the base. The light emitting device further includes a light reflecting portion, the light reflecting portion is formed on the top surface of the base, the light reflecting portion is defined around the light emitting diode chip, a height of the light reflecting portion is less than a height of the light emitting diode chip.

10 Claims, 6 Drawing Sheets

LIGHT EMITTING DEVICE

FIELD

The subject matter herein generally relates to a light emitting device.

BACKGROUND

Light emitting diodes are widely used as display components in the field of displays. The display component includes a plurality of light emitting devices, each light emitting device includes a light emitting diode chip and a base. The light emitting diode chip is formed on the base, and a size of the light emitting diode chip is the same as a size of the base, thereof consuming more raw materials in the manufacturing process and consuming more electric power when in use. So, if the size of the light emitting diode chip is less than the size of the base, that will consume less raw materials and less electric power.

However, if the size of the light emitting diode chip is less than the size of the base, a portion of the light will emitted from side surfaces of the light emitting diode chip, thereby reducing a front light intensity of the light emitting diode chip and increasing a glare index.

BRIEF DESCRIPTION OF THE DRAWINGS

Implementations of the present technology will now be described, by way of example only, with reference to the attached figures.

DETAILED DESCRIPTION

Figure 1:
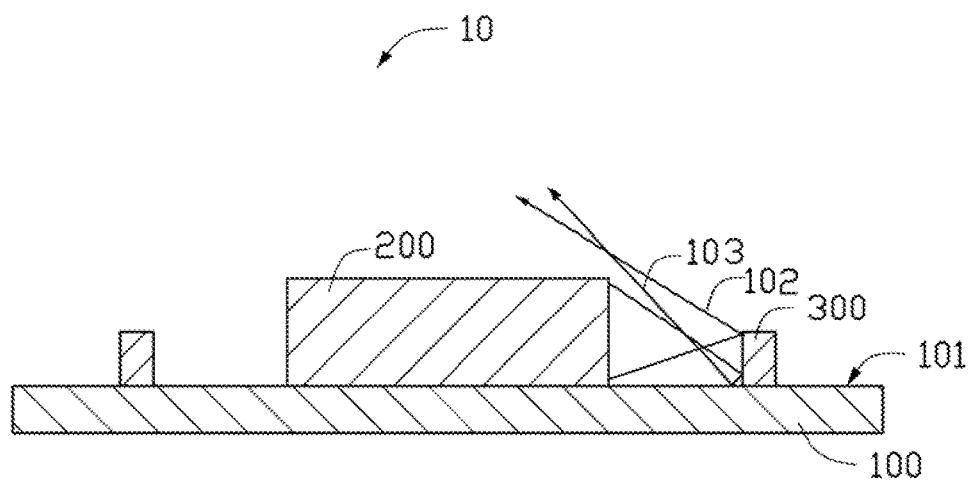
FIG. 1 is a cross section view of a light emitting device according to an exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series and the like.

A light emitting device comprising:

a base;

a light emitting diode chip formed on a top surface of the base, an outline of a projection of the light emitting diode chip projected on the top surface of the base being positioned in the top surface of the base; and a light reflecting portion formed on the top surface of the base and defined around the light emitting diode chip, a height of the light reflecting portion being less than a height of the light emitting diode chip.

A length of the light emitting diode chip is less than 50 μm.

The height of the light reflecting portion is less than 20 μm.

The light reflecting portion is a ring around the light emitting diode chip.

The light reflecting portion comprises a plurality of columns.

A first gap is defined between two adjacent columns of the plurality of columns.

The light emitting device further comprises a block, the block is formed on the base and around the light reflecting portion.

A second gap is defined between the block and the light reflecting portion.

A height of the block is less than the height of the light emitting diode chip.

The height of the block is more than the height of the light reflecting portion.

The height of the block is less than the height of the light emitting diode chip and more than the height of the light reflecting portion.

Referring to FIG. 1, FIG. 1 is a cross section view of a light emitting device 10 according an exemplary embodiment of to the present disclosure.

The light emitting device 10 comprises a base 100, a light emitting diode chip 200 and a light reflecting portion 300.

The base 100 can be made of thin film transistor (TFT), indium gallium zinc oxide (IGZO) or liquid crystal. The base 100 can comprise a circuit structure (not explicitly shown).

A top surface 101 is defined on the base 100. The light emitting diode chip 200 is formed on the top surface 101 of the base 100. An outline 201 of a projection 202 of the light emitting diode chip 200 projected on the top surface 101 of the base 100 is positioned in the top surface 101 of the base 100. A length 203 of the light emitting diode chip 200 can be less than 50 μm. A width 204 of the light emitting diode chip 200 can be less than 50 μm.

The light emitting diode chip 200 can comprise a substrate, a first semiconductor layer, an active layer, and a second semiconductor layer (not explicitly shown). The first semiconductor layer, the active layer, and the second semiconductor layer are successively formed on the substrate.

In at least one embodiment, the first semiconductor layer can be an N-type doped semiconductor layer, and the second semiconductor layer can be a P-type doped semiconductor layer. In an alternative embodiment, the first semiconductor layer and the second semiconductor layer can be a P-type doped semiconductor layer and an N-type doped semiconductor layer, respectively.

The light reflecting portion 300 is formed on the top surface 101 of the base 100. The light reflecting portion 300 can be defined around the light emitting diode chip 200. The light emitting diode chip 200 is positioned at a center of the light reflecting portion 300.

A height of the light reflecting portion 300 can be less than a height of the light emitting diode chip 200. A height of the light reflecting portion 300 can be less than 20 μm.

Light 102 emitted from side surfaces of the light emitting diode chip 200 is reflected by the light reflecting portion 300. Light 103 side surfaces of emitted from the light emitting diode chip 200 is reflected by the light reflecting portion 300 and the base 100.

The light reflecting portion 300 can reflect light emitted from side surfaces of the light emitting diode chip 200 for increasing a front light intensity of the light emitting diode chip 200 and decreasing a glare index.

The light reflecting portion 300 can be made of silicon, epoxy, aluminum (Al), nickel (Ni), titanium (Ti), silver (Ag), copper (Cu) and chromium (Cr), silica ($SiO_2$), titanium oxide ($TiO_2$) or carbon (C).

Figure 2:
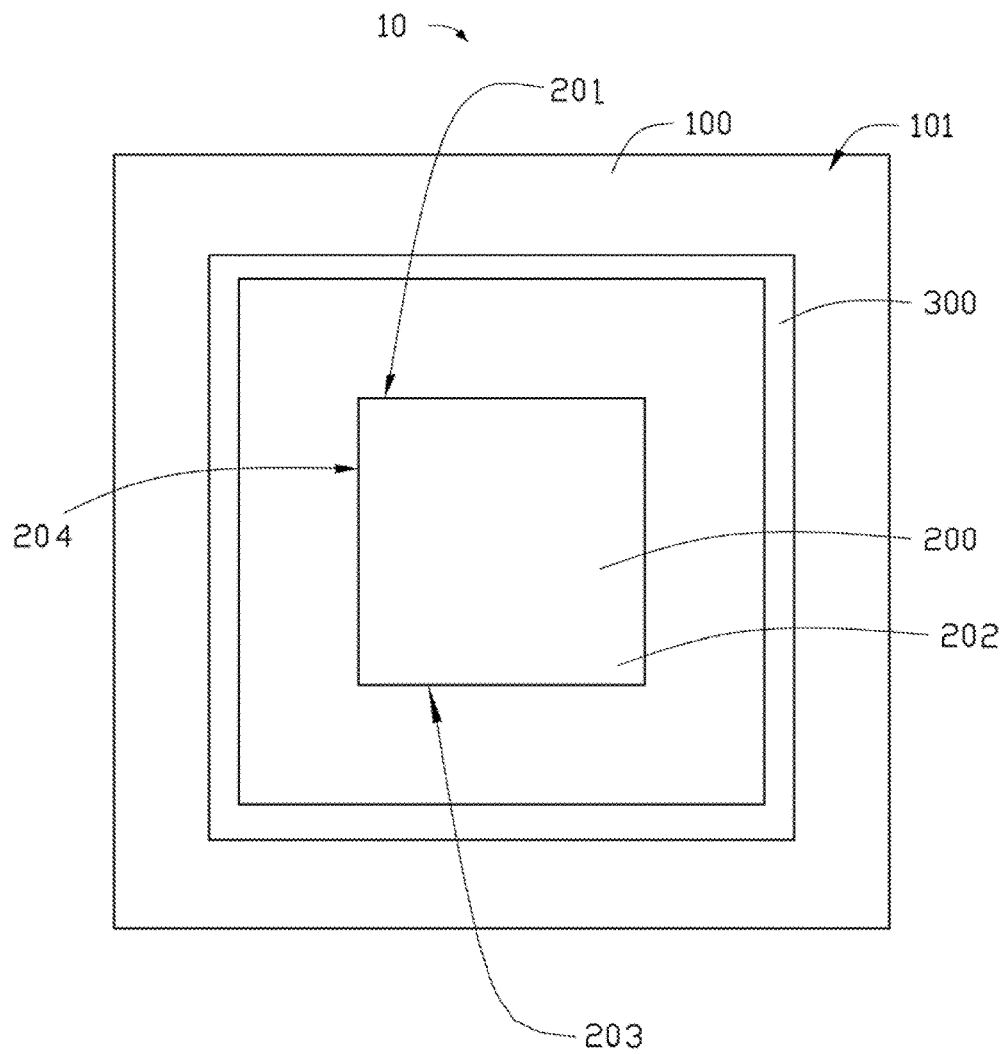
FIG. 2 is a top plan view of a light emitting device according to a first exemplary embodiment of the present disclosure.

Referring to FIG. 2, FIG. 2 is a top plan view of a light emitting device according to a first exemplary embodiment of the present disclosure.

The light reflecting portion 300 can be a ring. The light reflecting portion 300 can be a rectangular ring (referring to FIG. 2). In another exemplary embodiment, the light reflecting portion 300 can be a circular ring.

Figure 3:
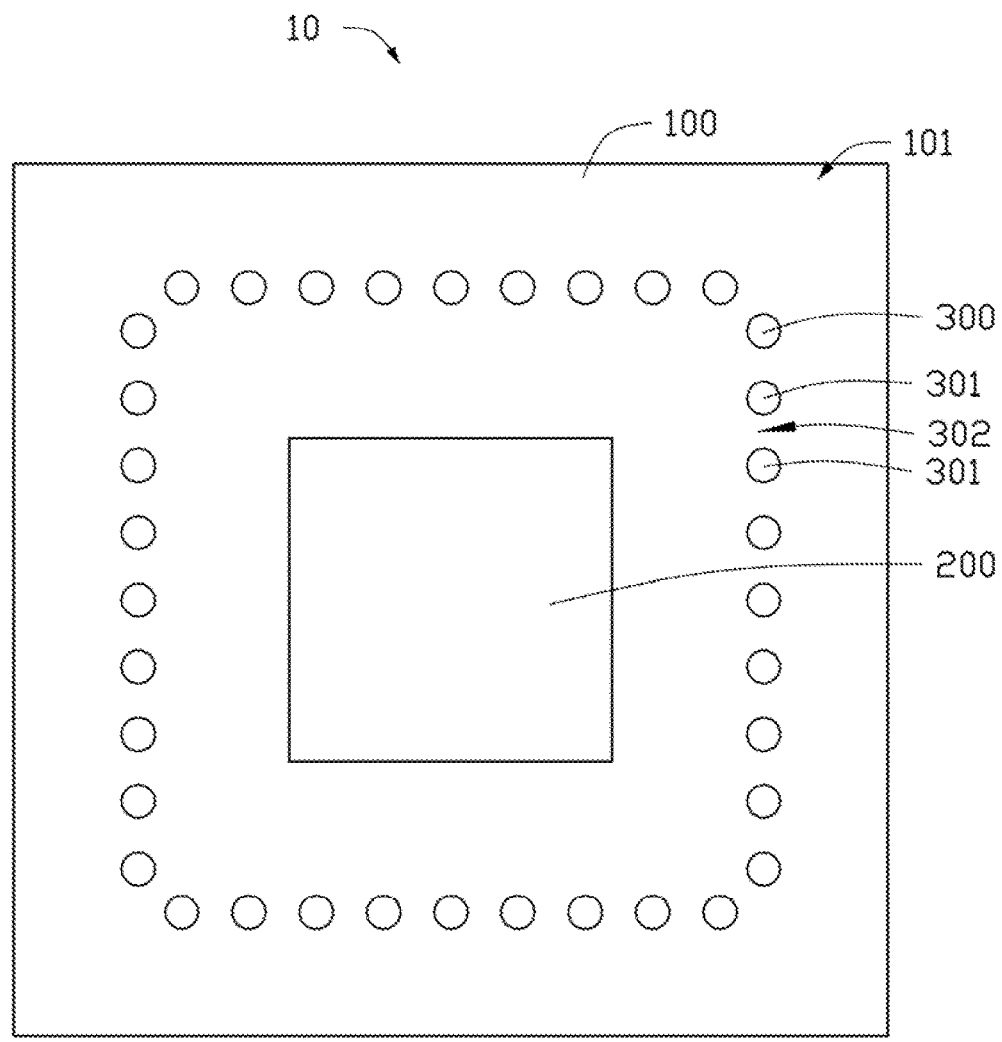
FIG. 3 is a top plan view of a light emitting device according to a second exemplary embodiment of the present disclosure.
Figure 4:
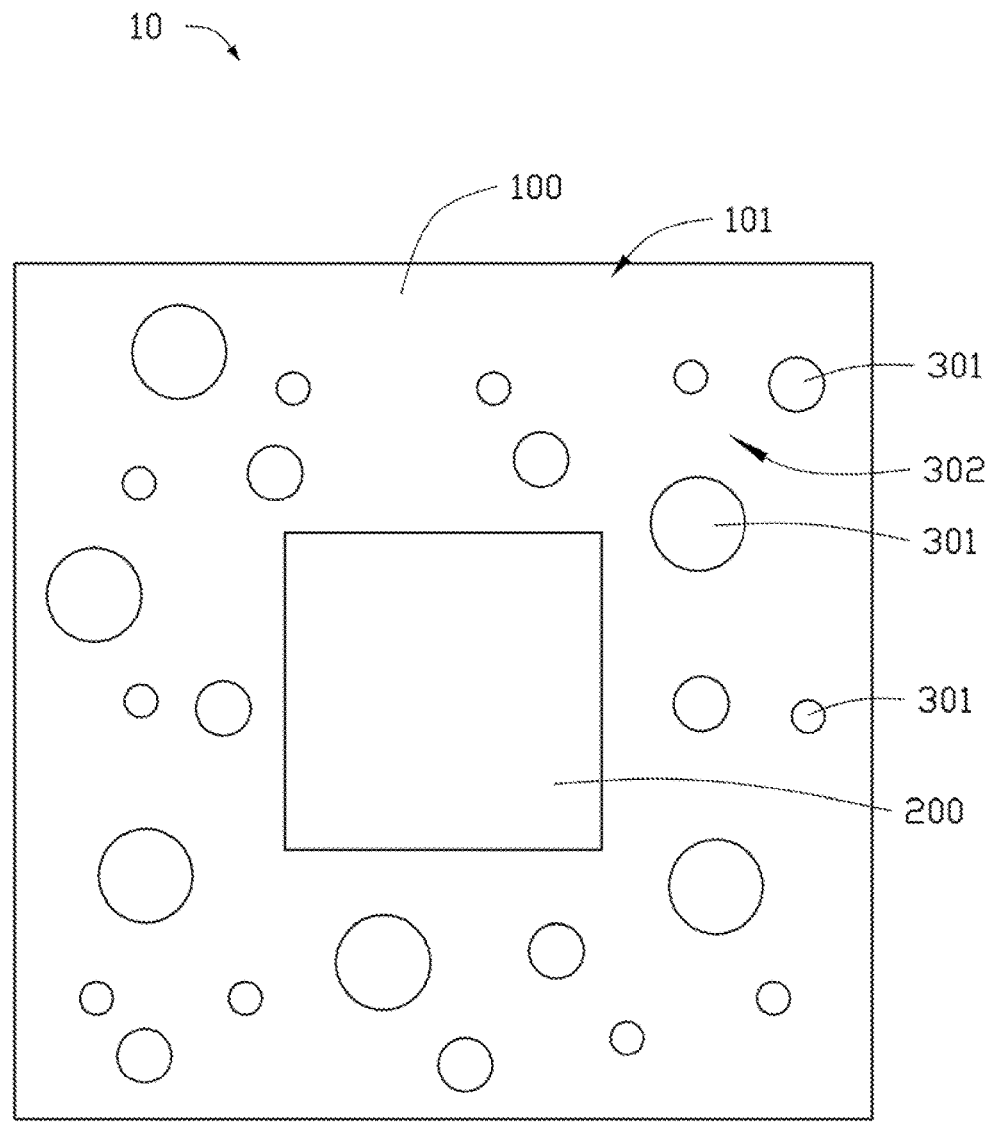
FIG. 4 is a top plan view of a light emitting device according to a third exemplary embodiment of the present disclosure.

Referring to FIGS. 3 and 4, FIG. 3 is a top plan view of a light emitting device according to a second exemplary embodiment of the present disclosure. FIG. 4 is a top plan view of a light emitting device according to a third exemplary embodiment of the present disclosure.

The light reflecting portion 300 can comprise a plurality of columns 301. A first gap 302 can be defined between two adjacent columns 301. Each column 301 can be cylinder, triangular prism or pyramid (not explicitly shown). The columns 301 can be defined around at least one circle corresponding to the light emitting diode chip 200 (referring to FIG. 3). The columns 301 can be defined as desired around the light emitting diode chip 200. As illustrated in FIG. 4, the columns 301 can have different diameters (e.g., three different diameters).

Figure 5:
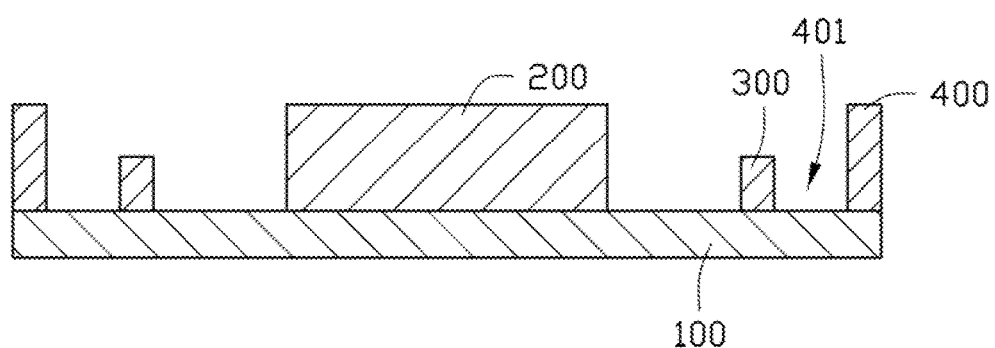
FIG. 5 is a cross section view of a light emitting device according to a fourth exemplary embodiment of the present disclosure.
Figure 6:
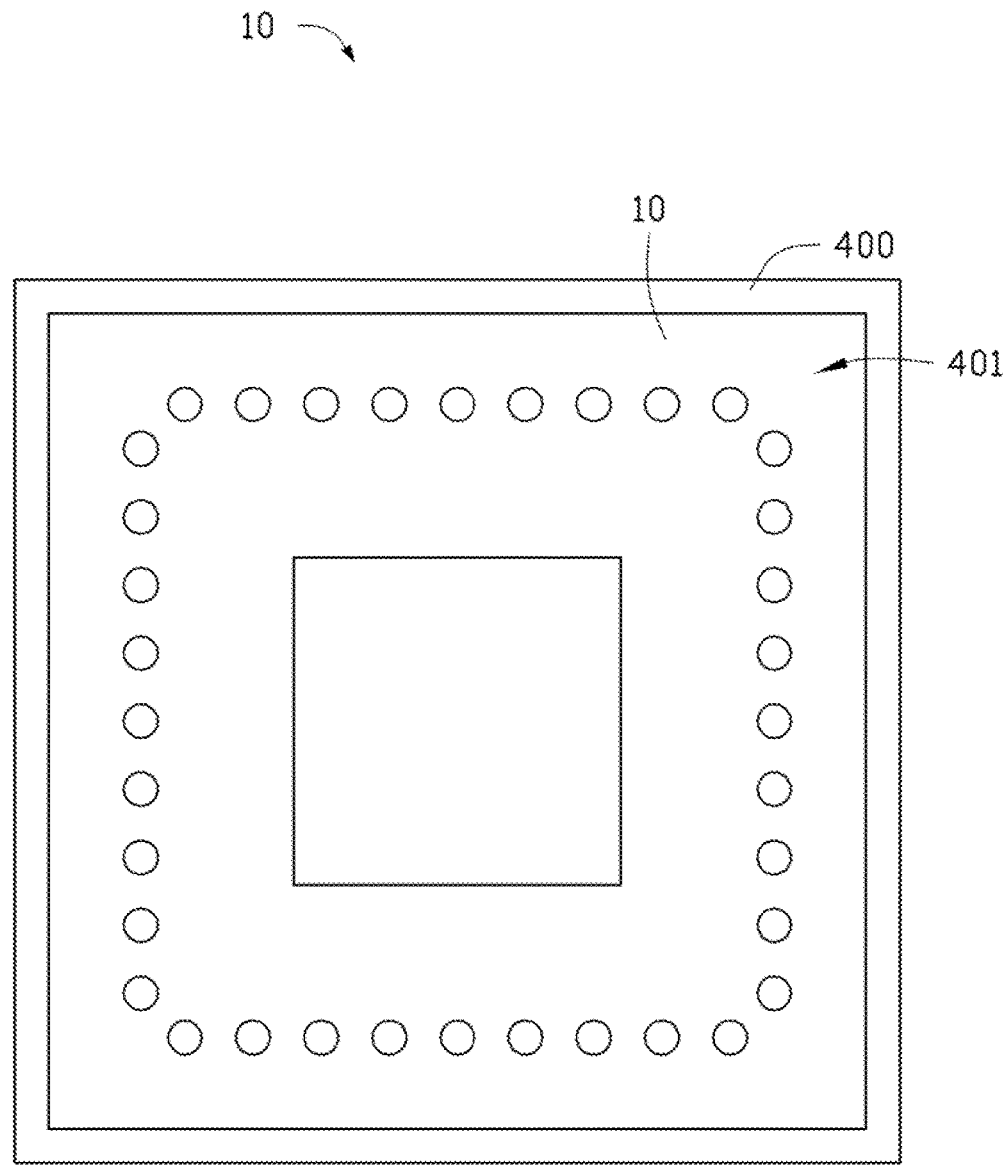
FIG. 6 is a top plan view of the light emitting device according to the fourth exemplary embodiment of the present disclosure.

Referring to FIGS. 5 and 6, FIG. 5 is a cross section view of a light emitting device according to a fourth exemplary embodiment of the present disclosure. FIG. 6 is a top plan view of the light emitting device according to the fourth exemplary embodiment of the present disclosure.

The light emitting device 10 can comprise a block 400. The block 400 is formed on the base 100 and around the light reflecting portion 300. A height of the block 400 is less than the height of the light emitting diode chip 200, and more than the height of the light reflecting portion 300. A second gap 401 is defined between the block 400 and the light reflecting portion 300. The block 400 can reflect light emitted from the side surfaces of the light emitting diode chip 200.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A light emitting device comprising:
   a base;
   a light emitting diode chip formed on a top surface of the base, an outline of a projection of the light emitting diode chip projected on the top surface of the base being positioned in the top surface of the base; and
   a light reflecting portion formed on the top surface of the base and defined around the light emitting diode chip, a height of the light reflecting portion being less than a height of the light emitting diode chip, wherein the light reflecting portion comprises a plurality of columns.

2. The light emitting device of claim 1, wherein a length of the light emitting diode chip is less than 50 μm.

3. The light emitting device of claim 1, wherein the height of the light reflecting portion is less than 20 μm.

4. The light emitting device of claim 1, wherein the light reflecting portion is a ring around the light emitting diode chip.

5. The light emitting device of claim 1, wherein a first gap is defined between two adjacent columns of the plurality of columns.

6. The light emitting device of claim 1 further comprises a block, the block is formed on the base and around the light reflecting portion.

7. The light emitting device of claim 6, wherein a second gap is defined between the block and the light reflecting portion.

8. The light emitting device of claim 6, wherein a height of the block is less than the height of the light emitting diode chip.

9. The light emitting device of claim 6, wherein a height of the block is more than the height of the light reflecting portion.

10. The light emitting device of claim 6, wherein the height of the block is less than the height of the light emitting diode chip and more than the height of the light reflecting portion.

* * * * *